May 5, 1959 G. C. SZIKLAI ET AL 2,885,495

EMITTER COUPLED TRANSISTOR AMPLIFIER

Filed March 24, 1954

INVENTORS
GEORGE C. SZIKLAI
& ROBERT D. LOHMAN

BY H. L. Newton [signature]
ATTORNEY 2,885,495

EMITTER COUPLED TRANSISTOR AMPLIFIER

George C. Sziklai and Robert D. Lohman, Princeton, N.J., assignors to Radio Corporation of America, a corporation of Delaware Application March 24, 1954, Serial No. 418,255

6 Claims. (Cl. 179—171)

Figure 1:
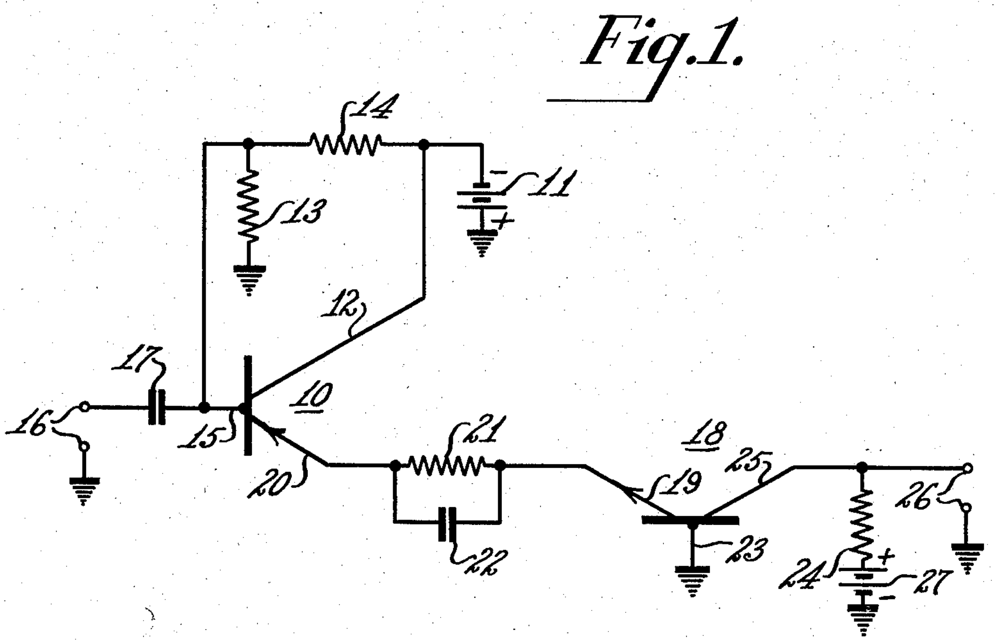

This invention relates generally to semiconductor signal translating circuits, and particularly to direct coupled multistage semiconductor signal translating circuits utilizing semiconductor amplifier devices of opposite conductivity types.

Amplification of the direct current component of signal energy as well as the low and higher frequency components of signal energy is often desired in the electronic arts. There has been some difficulty in achieving this objective with electron discharge devices because of the static direct current voltage requirements of such devices. The problem was further complicated due to the fact that electron discharge devices are voltage operated devices. That is, the output voltage is primarily a function of the input voltage.

In contrast to electron discharge devices, semiconductor devices are generally considered to be both voltage and current (power) operated devices, and generally the output voltage is considered to be primarily a function of the input current. Semiconductor devices, however, provide essentially a low input impedance and a high output impedance. This imposes a problem in matching the input and output impedances of cascade coupled circuits to provide the efficient translation of signal energy.

In addition to efficient translation of signal energy, it is, of course, most desirable to utilize circuits having stable operating characteristics which are substantially unaffected by changes in components or temperature. Accordingly, it is preferred to operate semiconductor amplifier devices from a substantially constant current source as this provides maximum stability of operation.

Semiconductor amplifier devices known as transistors have been developed as two distinct conductivity types. These are generally referred to as N type and P type. It is to be understood that an N type device denotes either a point contact transistor having an N type semiconductive body or a P–N–P junction transistor. It is also to be understood that a P type device denotes a point contact transistor having a P type semiconductive body or an N–P–N junction device. These semiconductor devices of opposite conductivity types may be used to advantage in various circuit configurations as is shown and discussed in an article "Symmetrical Properties of Transistors and Their Applications," by G. C. Sziklai in Proceedings of the IRE, June 1953, pp. 717–724.

It is accordingly an object of the present invention to provide a stable direct-coupled semiconductor signal translating circuit utilizing semiconductor amplifier devices of opposite conductivity type.

It is another object of the present invention to provide a stable direct-coupled broad-band semiconductor signal translating circuit utilizing semiconductor amplifier devices of opposite conductivity types.

It is still another object of the present invention to provide a stable direct-coupled single frequency signal translating circuit utilizing semiconductor amplifier devices of opposite conductivity types.

In accordance with the present invention, a pair of semiconductor devices of opposite conductivity types are provided in a cascade coupled signal translating circuit. The first semiconductor device is utilized in a grounded collector signal amplifier circuit and the second semiconductor device is utilized in a grounded base signal amplifier circuit. A common direct current path and signal coupling is provided by the direct current interconnection of the emitter electrodes of each of the two devices. Operating bias is provided for the signal translating system from a source connected respectively to each of the collector electrodes of the semiconductor devices. Accordingly a relatively high input impedance is provided by the system along with broad band stable operation.

Figure 2:
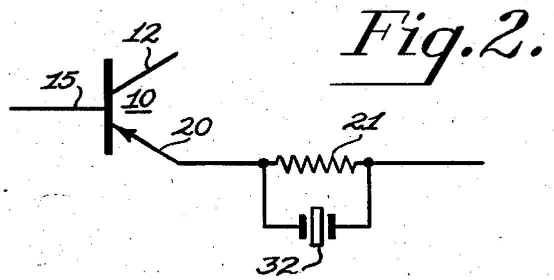

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of a cascade coupled signal translating circuit in accordance with the present invention; and Figure 2 is a modification of a portion of the circuit of Figure 1, in accordance with the invention.

Referring now to the drawing, wherein like reference numerals designate like elements in both figures, and referring particularly to Figure 1, a first semiconductor device or transistor 10 is illustrated as an N type device and accordingly may be a P–N–P junction transistor which is arranged in a grounded collector signal amplifier circuit. Operating bias is provided from a source of voltage, illustrated as a battery 11, which is connected between a collector electrode 12 and a point of fixed reference potential such as ground. The proper operating point for the transistor 10 is established by a biasing network comprising a pair of resistors 13 and 14 connected in series between the negative terminal of the battery 11 and ground.

The base electrode 15 of the transistor 10 is connected to the junction of the bias resistors 13 and 14 to provide a base bias for the transistor. An input signal may be applied from any convenient source, such as the video detector in a television receiving circuit, to a pair of input terminals 16, one of which is connected to ground. The other of the input terminals 16 is coupled to the base electrode 15 through a coupling capacitor 17.

A transistor signal amplifier circuit of the grounded collector type is somewhat unique in the respect that there is essentially no isolation between the input and output circuits. That is to say, the input impedance offered by the amplifier circuit is determined primarily by the product of the quantity one plus the numerical ratio of the current gain from the collector electrode to the base electrode times the numerical value of the load impedance connected to the emitter electrode. It may be seen from this that the input impedance of such an amplifier circuit may be adjusted to provide a desired input impedance by selecting an appropriate load circuit. It is further readily seen that such an amplifier circuit essentially provides current amplification and is highly degenerative from a voltage amplification aspect.

A second semiconductor device or transistor 18, which is of a conductivity type opposite to the conductivity type of the transistor 10, is connected in a grounded base signal amplifier circuit. It is noted that the second transistor 18 is illustrated as a P type transistor or a junction transistor of the N–P–N variety. If the first transistor 10 were of the P type variety, the second transistor would have to be of the N type.

The input circuit for the second transistor 18 comprises a single direct current conductive connection between the emitter electrode 19 of the transistor 18 and the emitter electrode 20 of the transistor 10. This may be a direct connection without additional impedance elements or may be, as illustrated in the drawing, an RC network comprising the parallel arrangement of an impedance element, illustrated as a resistor 21, and a reactive element, illustrative as a capacitor 22. This network is connected serially between the two emitter electrodes 19 and 20. The base electrodes 23 of the transistor 18 is connected directly to ground to complete the input circuit for the transistor 18 and for the signal translating system. A load impedance, illustrated as a resistor 24, is connected between the collector electrode 25 and a source of fixed potential illustrated as a battery 27, and output energy may be coupled to a utilization circuit through a pair of output terminals 26, one of which is connected directly to ground, the other of which is connected to the collector electrode 25.

A grounded base transmitter amplifier circuit offers considerable isolation between the input and output circuits. Accordingly, it is seen that for the signal translating system provided in accordance with the present invention, isolation between the input and output circuits is established or provided by the grounded base amplifier circuit. A grounded base transistor amplifier circuit further provides considerable voltage amplification which in many applications is necessary to the operation of the overall system.

From the foregoing discussion it may be seen that the coupling network connected between the two emitter electrodes 19 and 20 in combination with the input impedance of the second transistor 18 provides the load impedance for the first transistor 10. It is, therefore, the combined impedance of these two elements which, at a given frequency, determines the input impedance of the overall system.

It is well known that a series RC network is a frequency selective system in that the impedance offered to signal energy is inversely proportional to frequency. Accordingly, it is readily apparent that the input energy, which is applied to the second transistor 18 will be increased as the frequency of signal to be amplified is increased. This effectively increases the gain of the system at the higher frequencies thereby enabling broad band amplification such as is needed in video amplifiers.

Referring now to Figure 2, it has been found that if the capacitor 22 is replaced by a piezoelectric device such as a crystal 32, the system operates stably and efficiently as what is commonly known as a crystal ringing circuit. This type of circuit has found wide usage in color television receiving systems to provide a standard reference wave for the operation of synchronous demodulator circuits.

Accordingly, it may be readily seen that if a crystal 32 of appropriate frequency is substituted for the capacitor 22 and a gated amplifier is utilized to gate signal energy of a predetermined reference frequency and thereby apply this signal energy at predetermined intervals to the input terminals 16, the signal energy will be applied to the crystal 32 thereby energizing the crystal 32 at a predetermined frequency to provide an output signal at the terminals 26 having a frequency which is determined by the frequency of the crystal 32. With this system it is possible to provide a continuous output wave at the output terminals 26 having a frequency precisely determined by the crystal.

Crystal ringing circuits which are well known normally utilize electron discharge devices and expensive transformers in their operation. Crystal ringing circuits have also been constructed which may be considered analogous to the corresponding electron discharge device circuits in that the circuit configurations utilized are somewhat similar, and expensive transformers are required in their operation.

It is seen from the foregoing discussion that the present circuit provides efficient crystal ringing without the necessity of utilizing additional circuit elements. Stability of operation is provided in view of the system characteristics above discussed.

It is, therefore, believed to be readily apparent that the emitter coupled transistor amplifier provided in accordance with the present invention may be utilized as a broad band amplifier capable of efficiently amplifying signal energy over a broad band of frequencies including direct current and which may be further utilized as a single frequency signal translating circuit. These objectives are accomplished while ulilizing a minimum of circuit elements.

What is claimed is:

1. A two-stage single frequency signal amplifier comprising an N type semiconductor device and a P type semiconductor device, each of said devices having emitter, base and collector electrodes, means connecting said semiconductor devices in cascade relation consisting of a signal coupling circuit capable of passing direct current and including a piezoelectric device connected between said emitter electrodes thereby providing a direct-current and signal coupling interconnection therebetween, said signal coupling path providing the sole direct current path for emitter current of said devices, means for biasing each of said semiconductor devices comprising a source of energizing potential connected to the collector electrode of each of said devices, a signal input circuit coupled between the base and collector electrodes of one of said devices to apply signals thereto, said one of said devices being connected for common collector operation and signal output means coupled with the collector electrode of the other of said devices for deriving an output wave from said signal translating circuit, said other of said devices being connected for common base operation.

2. A signal translating circuit comprising, an N type semiconductor device and a P type semiconductor device, each of said devices having emitter, base and collector electrodes, means connecting said semiconductor devices in cascade relation consisting of a circuit capable of passing direct current connected between said emitter electrodes thereby providing a direct-current conductive and signal coupling interconnection therebetween and the sole direct current path for emitter current thereof, means for biasing each of said semiconductor devices comprising of a source of energizing potential connected between said collector electrodes, a signal input circuit coupled between the base and collector electrodes of one of said devices to apply signals thereto, said one of said devices being connected for common collector operation, and signal output means coupled between the collector and base electrodes of the other of said devices for deriving an output wave from said signal translating circuit, said other of said devices being connected for common base operation.

3. A signal translating circuit comprising, a pair of semi-conductor devices of opposite conductivity types arranged in cascade relation, each of said devices including emitter, base and collector electrodes, coupling means consisting of a galvanically conducting impedance element connected between said emitter electrodes for providing a direct-current conductive and signal coupling path therebetween, and the sole direct current path for emitter current thereof, means for biasing the base and collector electrodes of each of said devices in a reverse direction and for biasing the base and emitter electrodes of each of said devices in a forward direction consisting of a source of energizing potential connected between the collector electrode of each of said pair of devices and a point of fixed reference potential, a signal input circuit coupled to the base electrode of one of said pair of semiconductor devices, said one of said devices being connected for common collector operation, and an output impedance element coupled to the collector electrode of the other of said pair of cascade coupled semiconductor devices, said other of said devices being connected for common base operation.

4. A signal translating circuit comprising, a first and second semiconductor device of opposite conductivity types, each of said devices having emitter, base and collector electrodes, a signal input circuit connected to the base electrode of said first device, said first device being connected for grounded collector operation, means for deriving an output signal wave from the collector electrode of said second device, said second device being connected for grounded base operation, a resistor connected between said emitter electrodes for providing the sole direct current path between said devices and the sole direct current path for emitter current thereof, a capacitor connected in shunt with said resistor, and means for applying a reverse bias between each of said collector electrodes and the respective base electrode and for applying a forward bias between each of said emitter electrodes and the respective base electrode consisting of a source of direct current bias connected between said collector electrodes.

5. A signal translating circuit comprising, a first and a second semiconductor device of opposite conductivity types, each of said devices having emitter, base and collector electrodes, a signal input circuit connected to the base electrode of said first device, said first device being connected for grounded collector operation, a load resistor connected between the collector electrode of said second device and a point of fixed reference potential for deriving an output signal wave therefrom, said second device being connected for grounded base operation, a coupling resistor connected between said emitter electrodes for providing the sole direct current path between said devices and the sole direct current path for emitter current thereof, a capacitor connected in shunt with said resistor, and means for applying a reverse bias between each of said collector electrodes and the respective base electrode and for applying a forward bias between each of said emitter electrodes and the respective base electrode consisting of a source of direct current bias connected between said collector electrodes.

6. A signal translating circuit comprising, in combination, a first transistor of one conductivity type including base, emitter, and collector electrodes, said first transistor being connected in said circuit for grounded collector operation, a second transistor of an opposite conductivity type including base, emitter, and collector electrodes, said second transistor being connected in said circuit for gounded base operation, means providing a signal input circuit connected for applying an input signal between the base electrode for said first transistor and a point of ground potential in said circuit, direct-current supply means having a pair of terminals one of which is connected with the collector electrode of said first transistor and the other of which is connected with the collector electrode of said second transistor, means providing a direct-current conductive connection between the emitter of said first transistor and the emitter of said second transistor to provide a series direct-current conductive path including the emitter and collector electrodes of each of said transistors between the terminals of said supply means and a signal coupling path between the emitter of said first transistor and the emitter of said second transistor, said direct-current conductive connection providing the sole direct-current path for emitter current of said transistors, means connecting the base electrode of said second transistor to said point of ground potential, and signal output circuit means connected for deriving an output signal from between the collector and base electrodes of said second transistor.

References Cited in the file of this patent

UNITED STATES PATENTS

| | | |
|---|---|---|
| 1,765,293 | Whelan | June 17, 1930 |
| 1,967,249 | Mason | July 24, 1934 |
| 2,275,023 | White | Mar. 3, 1942 |
| 2,324,279 | Clark | July 13, 1943 |
| 2,595,496 | Webster | May 6, 1952 |
| 2,666,818 | Shockley | Jan. 19, 1954 |
| 2,666,819 | Raisbeck | Jan. 19, 1954 |
| 2,730,576 | Caruthers | Jan. 10, 1956 |

FOREIGN PATENTS

| | | |
|---|---|---|
| 665,867 | Great Britain | Jan. 30, 1952 |

OTHER REFERENCES

Shea text, "Principles of Transistor Circuits," pp. 170–171, 175, 283–284, pub. 1953 by John Wiley & Sons, Inc., N.Y.C. Copy in Cl. Div. II.

Lohman article, "Electronics," September 1953, pp. 140–143. Copy in 179–171–MB.

Bell text, "The Transistor," pp. 398–411, pub. 1951 by Bell Tel. Labs., Inc., Murray Hill, N. J. Copy in Cl. Div. II.